FABRICATION OF THIN SILICON DEVICE CHIPS

Filed Nov. 29, 1967 2 Sheets-Sheet 1

INVENTOR
LOUIS N. POMANTE

BY Melvin Pearson Williams
ATTORNEY

FABRICATION OF THIN SILICON DEVICE CHIPS

Filed Nov. 29, 1967 2 Sheets-Sheet 2

3,478,418

FABRICATION OF THIN SILICON DEVICE CHIPS

Louis N. Pomante, Levittown, Pa., assignor to United Aircraft Corporation, East Hartford, Conn., a corporation of Delaware Filed Nov. 29, 1967, Ser. No. 686,611
Int. Cl. B01j 17/00; H01l 7/00
U.S. Cl. 29—574 2 Claims

ABSTRACT OF THE DISCLOSURE

A plurality of different circuit areas are formed on a silicon wafer using any conventional dielectric isolation technique. Then, electronic devices are formed in the areas and the areas are allowed to separate. The need for scribing and dicing is avoided, and therefore the need for a device of a given thickness (on the order of three or four mils) is eliminated; device chips as thin as one mil or less may be produced.

BACKGROUND OF THE INVENTION

Field of invention

This invention relates to the manufacture of semiconductor devices, and more particularly to thin silicon device chips and a method of manufacture therefor.

Description of the prior art

It is well known that semiconductor devices are manufactured by processing a wafer in which a plurality of discrete devices (such as transistors or diodes) are formed. When the devices are completely manufactured, the wafer is scribed and then it is broken into discrete parts, each part called a dice, each dice having one or a given plurality of devices in it. Because of the scribing and dicing operation, it is necessary that the final wafer product be of sufficient thickness so that the ratio of area of the chips being broken apart to the thickness of the wafer is sufficient so that the chips can be separated without being broken (or crumbling). This mechanical requirement for a certain minimal thickness, which may be on the order of three or four mils in current technology, results in a bulk of substrate material which is sufficiently thick so as to limit the transfer of heat from impurity junctions in a device through the substrate bulk and out of the bulk side of the device.

SUMMARY OF INVENTION

An object of the present invention is to provide semiconductor devices having a high heat transfer characteristic.

Antoher object of the present invention is to provide thin discrete semiconductor device chips.

According to the present invention, a plurality of semiconductor device chips are formed in a wafer by utilizing dielectric isolation techniques known to the prior art. Then, electronic devices are formed in the areas. Instead of being backfilled with silicon or other dielectric isolation, the devices are separated at this point, by removing the handle which holds the devices together, and eliminating the step of backfilling with dielectric material. The invention thereby avoids the necessity for mechanical separation of the various components on the wafer, which in turn, eliminates the need for mechanical strength. Thus, these devices may be made to thicknesses on the order of magnitude of one mil, which in turn provides a much smaller length of bulk in the substrate through which heat must be conducted in order to conduct heat away from the impurity junctions of the device through the back (or bulk) of the material to a mounting package or other heat sink to which the device is fastened.

The foregoing and other objects, features and advantages of the present invention will become more apparent in the light of the following detailed description of preferred embodiments thereof as illustrated in the accompanying drawing.

DESCRIPTION OF THE PREFERRED EMBODIMENT

Figure 1:
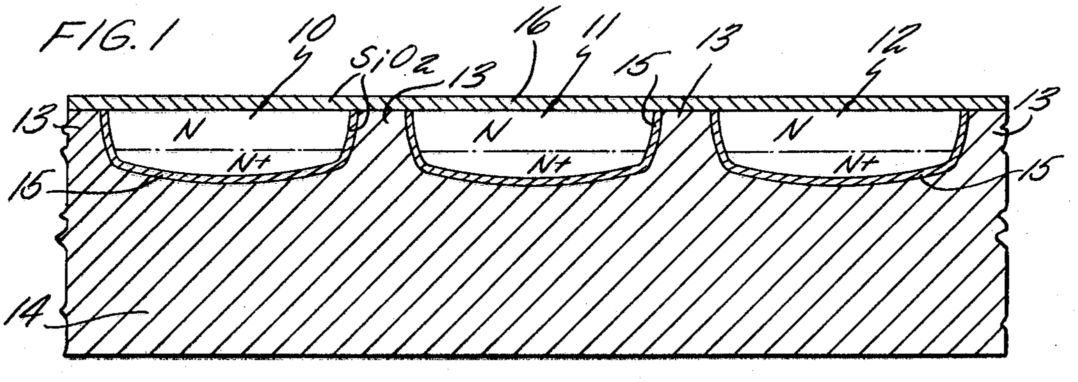
FIGS. 1–5 are sectioned side elevations of a portion of a wafer being processed through successive steps in accordance with the present invention.

Referring now to FIG. 1, a wafer is prepared using any one of several well known dielectric techniques, up to the point where discrete areas 10–12 are separated by moats 13, with polycrystalline silicon 14 providing a back-up bulk and filling the moat regions 13. Each of the discrete areas 10–12 may comprise either a monocrystalline body of a single conductivity type (which may be either P-type or N-type, being shown in the figures herein as N-type for simplicity only). On the other hand, each of the regions 10–12 may comprise an epitaxial N+ over N wafer; as a further alternative, the N+ region may be diffused into an N-type wafer so as to form an N+ over N area.

The processing required to reach the stage illustrated in FIG. 1 is, as described hereinbefore, suitably performed by any number of well-known methods illustrated in various publications. Suitable exemplary methods are referred to in an article entitled "Panel Appraises Outlook for Microcircuits," at page 79 et seq. of Aviation Week and Space Technology, Apr. 6, 1964. Briefly, a suitable starting wafer for the devices to make, whether a single-resistivity type (homogeneous) or epitaxial N+ over N (or, of course, P+ over P) may be fastened to a handle wafer, the device may then be lapped down to a given size, or may be suitably provided in the desired thickness so that lapping is not necessary. Then moats 13 are etched in the device wafer, each of the areas 10–12 still being disposed on a handle wafer. Then a layer of oxide ($SiO_2$) may be grown around the areas 10–12, following which polycrystalline silicon 14 is grown to fill the moats and supply bulk material to hold the device areas 10–12 together. Thereafter, the handle wafer can be stripped, and an oxide 16 grown over the face of the wafer. This yields a wafer as illustrated in FIG. 1.

Figure 2:
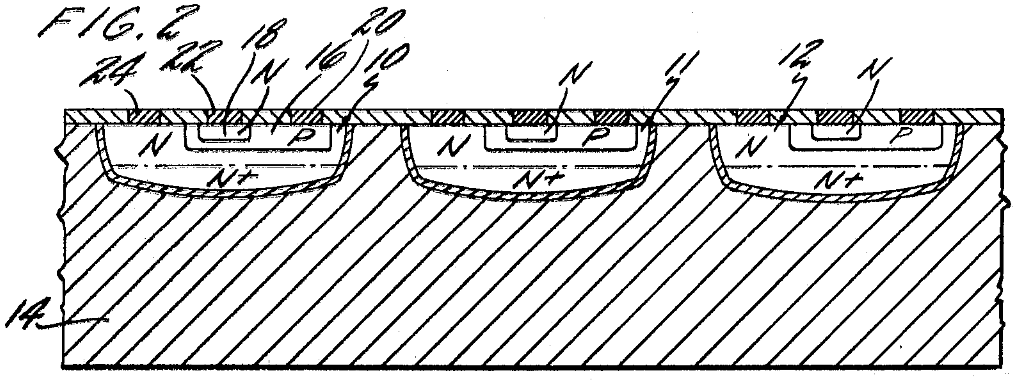

After the wafer is prepared as illustrated in FIG. 1, devices may be provided therein through the normal diffusion and metalization techniques. FIG. 2 illustrates the wafer prepared with transistors and metalized contact lands formed in the wafer. Specifically, each of the areas 10–12 is provided with a base diffusion 16 and an emitter diffusion 18 and metalized contact lands 20, 22 for the base and emitter, respectively. Additionally, a metalized contact 24 is provided for making contact with the collector of the transistor through the face of the devices so as to permit probing (electrical testing) of the devices as soon as they are prepared to the degree illustrated in FIG. 2. Thus, all bad devices may be marked while the devices are still attached together by the polycrystalline material and their faces are available for contact by the probing machine.

Figure 3:
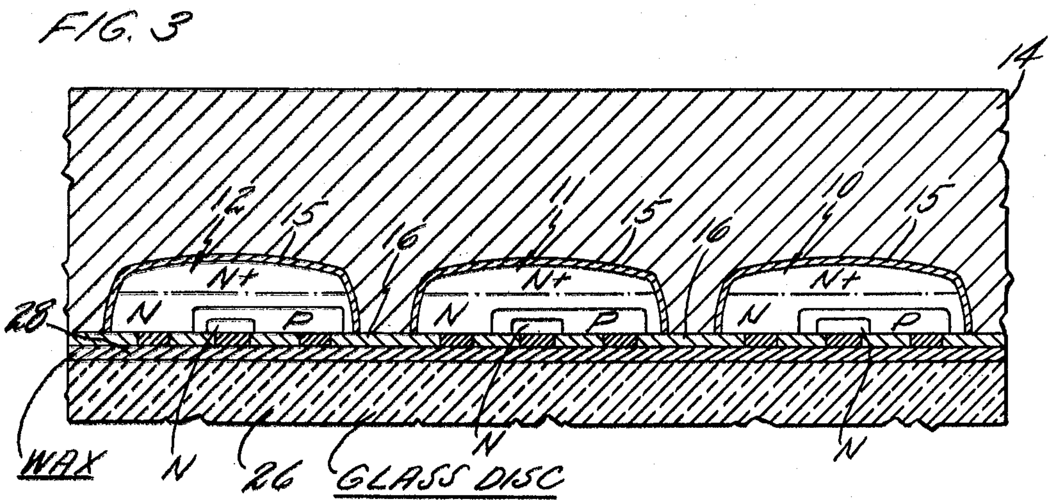
Figure 4:
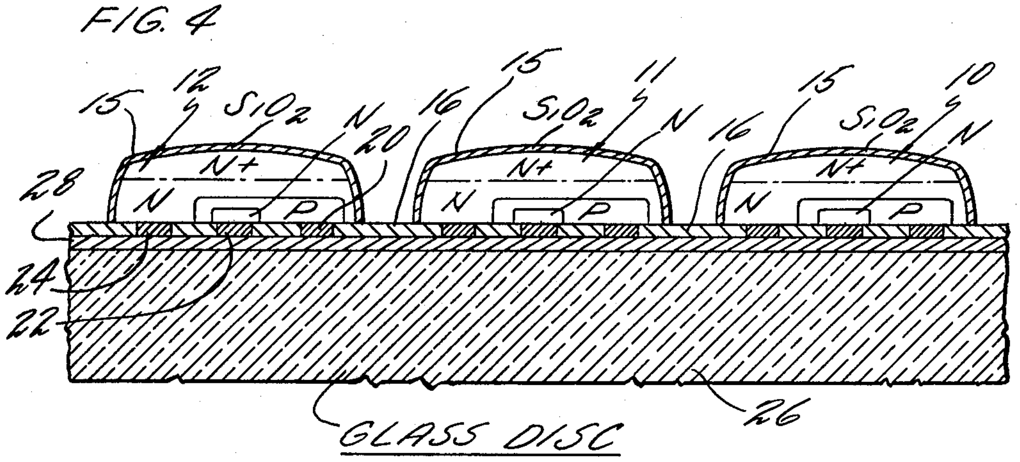
Figure 5:
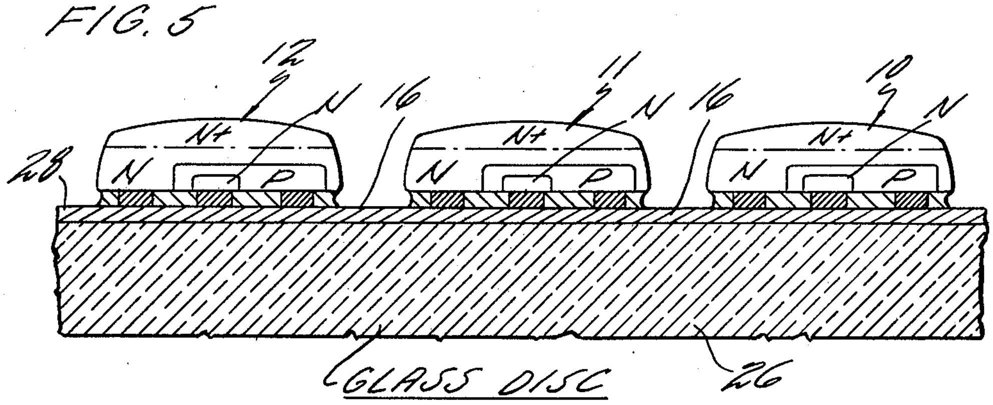

After the devices are built and tested, the wafer of FIG. 2 is attached, face down, to a glass disc 26 by means of wax 28 or other suitable temporary adherent, as is well known in the art (FIG. 3). Once this is done, the polycrystalline material may be stripped, such as in a mixture of hydrofluoric, nitric, and acidic acids, as is well known in the art (FIG. 4). The silicon dioxide 15, 16 protects the device areas 10–12 from the acid solution. Thereafter, the wafer may be placed in hydrofluoric acid to remove the silicon dioxide 15 and that portion of the silicon dioxide 16 which is adjacent to the moat areas, so as to leave the wafer as shown in FIG. 5. As illustrated in FIG. 5, a plurality of devices 10–12, each one completely independent, are attached together by a wax adherent 28 to a glass disc carrier 26. These devices are complete, and all that remains in the practice of the invention is to dip the wafer into a suitable wax dissolving solution so as to permit the wax to dissolve allowing the chips to fall into the bottom of a beaker. This step (removing the devices 10–12 from the glass disc) is identical to the removal of dice from a plastic carrier in the well-known scribing and dicing operation which the present invention obviates.

Figure 6:
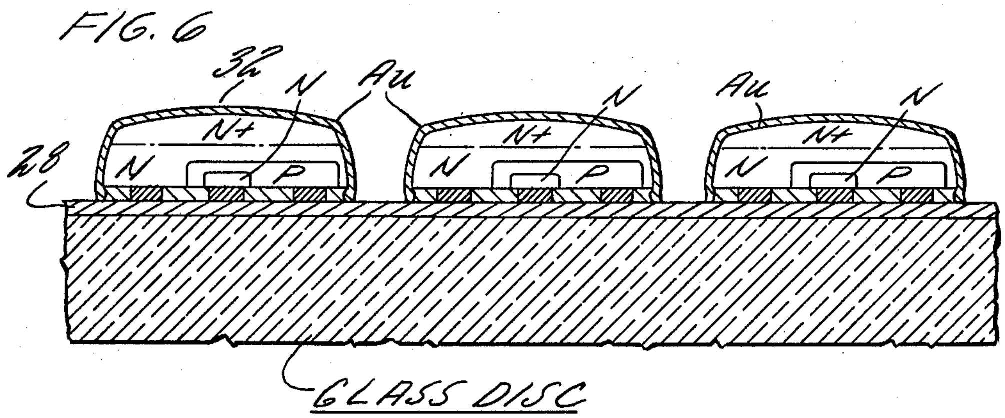
FIG. 6 is a sectioned side elevation of a portion of a wafer illustrating a final optional step which may be incorporated with the present invention.

If desired, an additional step may be provided as illustrated in FIG. 6. Therein, a thin layer of gold 32 has been plated over the backs of each of the devices including the areas within the moats. This may be desirable in fabricating certain devices, and may be applied in accordance with well-known teachings of the prior art. On the other hand, if gold plating is not desired, then the devices finished as illustrated in FIG. 5 and separated from the glass disc may be suitably mounted in packages by using gold preforms. Plating of gold on the back of the devices 10–12 as illustrated in FIG. 6 has the advantage that it limits the degree or depth of alloying that will take place into the N+ region of the devices themselves, thereby permitting the devices to be thinner than they may otherwise be if a gold preform is used to affix the devices to a package. This is so because it is necessary that the gold does not diffuse to a sufficient depth to electrically affect the base region of the transistor. On the other hand, if N+ diffusion is utilized, then the necessity for gold is mitigated. However, if desired, the N+ region and gold plating (as seen in FIG. 6) may both be used.

It should be understood that a typical example has been illustrated herein; to wit: the manufacture of discrete NPN transistors with N+ conductivity regions at the bottom of the collector bulk, both with and without gold plating. However, it should be understood by those skilled in the art that PNP transistors; transistors without N+ conductivity regions; diodes; capacitors; and other devices may be made utilizing the teaching of the present invention so as to avoid the necessity of mechanical scribing and dicing.

Although the invention has been shown and described with respect to preferred embodiments thereof, it should be understood by those skilled in the art that the foregoing and other changes and omissions in the form and detail thereof may be made therein without departing from the spirit and scope of the invention, which is to be limited and defined only as set forth in the following claims.

Having thus described typical embodiments of the invention, that which is claimed as new and to be secured by Letters Patent of the United States is:

1. In the preparation of thin silicon device chips without mechanical scribing the steps of:

preparing a composite wafer including a plurality of discrete monocrystalline areas at a surface of the wafer, said surface of the wafer and said areas being enclosed within a coating of silicon dioxide, said areas being contiguous to a bulk material for holding them together;

preparing solid state electronic components in said discrete device areas;

providing metalized contacts for said discrete electronic components;

testing and marking said electronic components;

attaching said surface of said wafer to a carrier with a temporary adherent; stripping said polycrystalline material from said wafer;

stripping the silicon dioxide from the back of said discrete device areas and from between said discrete device areas; and dissolving said temporary adherent so that said discrete device areas are freed from said carrier and are physically independent of one another.

2. The method according to claim 1 including the step of plating a thin layer of gold on the back of said devices prior to dissolving said temporary adherent.

References Cited

UNITED STATES PATENTS

| | | | |
|---|---|---|---|
| 2,984,897 | 5/1961 | Godfrey | 29—424 |
| 2,994,121 | 8/1961 | Shockley. | |
| 3,158,927 | 12/1964 | Saunders | 29—424 X |
| 3,343,255 | 9/1967 | Donovan | 29—423 X |
| 3,421,204 | 1/1969 | Baker et al. | 29—577 |

PAUL M. COHEN, Primary Examiner

U.S. Cl. X.R.

29—423, 424, 569, 580